United States Patent
Jenkins et al.

(10) Patent No.: US 7,446,523 B2
(45) Date of Patent: Nov. 4, 2008

(54) INTEGRATED SPECTRUM ANALYZER CIRCUITS AND METHODS FOR PROVIDING ON-CHIP DIAGNOSTICS

(75) Inventors: Keith Aelwyn Jenkins, Sleepy Hollow, NY (US); Anup Paul Jose, New York, NY (US); Scott Kevin Reynolds, Granite Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/524,598

(22) Filed: Sep. 21, 2006

(65) Prior Publication Data

US 2007/0013360 A1 Jan. 18, 2007

Related U.S. Application Data

(63) Continuation of application No. 10/900,733, filed on Jul. 28, 2004, now Pat. No. 7,116,092.

(51) Int. Cl.
*G01R 23/00* (2006.01)
*G01R 23/14* (2006.01)

(52) U.S. Cl. .................................. 324/76.19; 324/76.23

(58) Field of Classification Search ............. 324/76.19, 324/76.23, 76.11, 76.12, 76.22, 76.27, 76.28, 324/76.29, 76.43, 76.44, 76.46; 702/69, 702/76, 77

See application file for complete search history.

(56) References Cited

U.S. PATENT DOCUMENTS

| | | | |
|---|---|---|---|
| 3,729,738 A | 4/1973 | Cross et al. | 343/5 |
| 4,451,782 A * | 5/1984 | Ashida | 324/76.26 |
| 4,950,999 A | 8/1990 | Agnello et al. | 324/77 |
| 5,260,648 A * | 11/1993 | Brust | 324/158.1 |
| 5,262,957 A | 11/1993 | Hearn | 364/485 |
| 5,337,014 A * | 8/1994 | Najle et al. | 324/613 |
| 5,917,315 A * | 6/1999 | Weckstrom | 324/76.23 |
| 6,166,533 A | 12/2000 | Musha | 324/76.27 |
| 6,265,861 B1 | 7/2001 | Musha | 324/76.23 |
| 6,316,928 B1 | 11/2001 | Miyauchi | 324/76.27 |
| 6,621,277 B2 | 9/2003 | Mar | 324/622 |
| 6,728,528 B1 * | 4/2004 | Loke | 455/318 |
| 6,888,342 B2 * | 5/2005 | Bradley | 324/76.19 |
| 2003/0039319 A1 * | 2/2003 | Engelse et al. | 375/316 |
| 2004/0212385 A1 * | 10/2004 | Zyss et al. | 324/762 |

* cited by examiner

*Primary Examiner*—Vincent Q. Nguyen
*Assistant Examiner*—Hoai-An D Nguyen
(74) *Attorney, Agent, or Firm*—F. Chau & Associates, LLC

(57) ABSTRACT

Spectrum analyzer circuits and methods are provided which implement "zero-IF" (direct conversion) or "near-zero IF" (or very low IF) architectures that enable implementation of integrated (on-chip) spectrum analyzers for measuring the frequency spectrum of internal chip signals. An integrated spectrum analyzer circuit, which includes a zero IF or near-zero IF framework, enables a low-power compact design with sufficient resolution bandwidth for on-chip implementation and diagnostics of internal chip signals.

2 Claims, 3 Drawing Sheets

INTEGRATED SPECTRUM ANALYZER CIRCUITS AND METHODS FOR PROVIDING ON-CHIP DIAGNOSTICS

CROSS-REFERENCE TO RELATED APPLICATION

This application is a Continuation of U.S. patent application Ser. No. 10/900,733 filed on Jul. 28, 2004 now issued as U.S. Pat. No. 7,116,092, which is fully incorporated herein by reference.

TECHNICAL FIELD OF THE INVENTION

The present invention relates generally to on-chip diagnostic circuits and methods for measuring the frequency spectrum of internal chip signals. More specifically, the present invention relates to integrated spectrum analyzer circuits and methods which implement "zero-IF" (direct conversion) or "near-zero IF" (or very low IF) architectures that enable on-chip frequency spectrum. measurements of internal chip signals.

BACKGROUND

In analog and mixed-signal communication circuits, it is often desired to measure the frequency spectrum of signals generated by integrated circuits, components, devices, etc. For example, an output signal of a PLL (phase locked-loop) may be analyzed to determine if the signal frequency is at a required value, or to analyze the phase noise of the output signal, or to determine if there is any crosstalk from noise sources with nearby frequencies.

Typically, frequency spectrum analysis is performed by bringing a signal of interest off the chip via a dedicated I/O (input/output) pin and measuring the frequency content using an external spectrum analyzer. For this purpose, the I/O pin must be connected to the circuit of interest via a high bandwidth output driver that does not distort the signal to be measured. However, there are many disadvantages associated with this conventional process.

For example, the conventional method imposes a limit on the number of internal signals that can be measured. In particular, in a case where there is an array of circuits, such as a parallel bus of data channels all operating at similar, but not identical, frequencies, a frequency spectrum measurement using the conventional method requires multiple connections and disconnections. Thus, the measurement is time-consuming and not suitable for rapid testing. Furthermore, the number of points which can be measured is limited by the number of I/O pins that can be dedicated for the purpose of frequency spectrum measurements.

SUMMARY OF THE INVENTION

Exemplary embodiments of the invention include integrated spectrum analyzer circuits and methods which implement "zero-IF" (direct conversion) or "near-zero IF" (or very low IF) architectures that enable implementation of on-chip spectrum analyzers for measuring the frequency spectrum of internal chip signals. A semiconductor integrated spectrum analyzer circuit according to an exemplary embodiment of the invention, which comprises a zero IF or near-zero IF framework, enables a low-power compact design with sufficient resolution bandwidth for on-chip implementation and diagnostics of internal chip signals, thereby eliminating the need for an external spectrum analyzer.

On-chip spectrum analyzer circuits according to exemplary embodiments of the invention provide various advantages, including, for example, the ability to directly measure a plurality of internal nodes of the chip, elimination of additional high-speed I/O circuits, the ability to obtain measurements quickly for automated testing, if required, and on-chip digitization of the measured frequency spectrum of a desired signal so a digital representation of the spectrum can be acquired by a low speed digital tester.

These and other exemplary embodiments, aspects, features and advantages of the present invention will be described or become apparent from the following detailed description of exemplary embodiments, which is to be read in connection with the accompanying drawings.

DETAILED DESCRIPTION OF EXEMPLARY EMBODIMENTS

Figure 1:
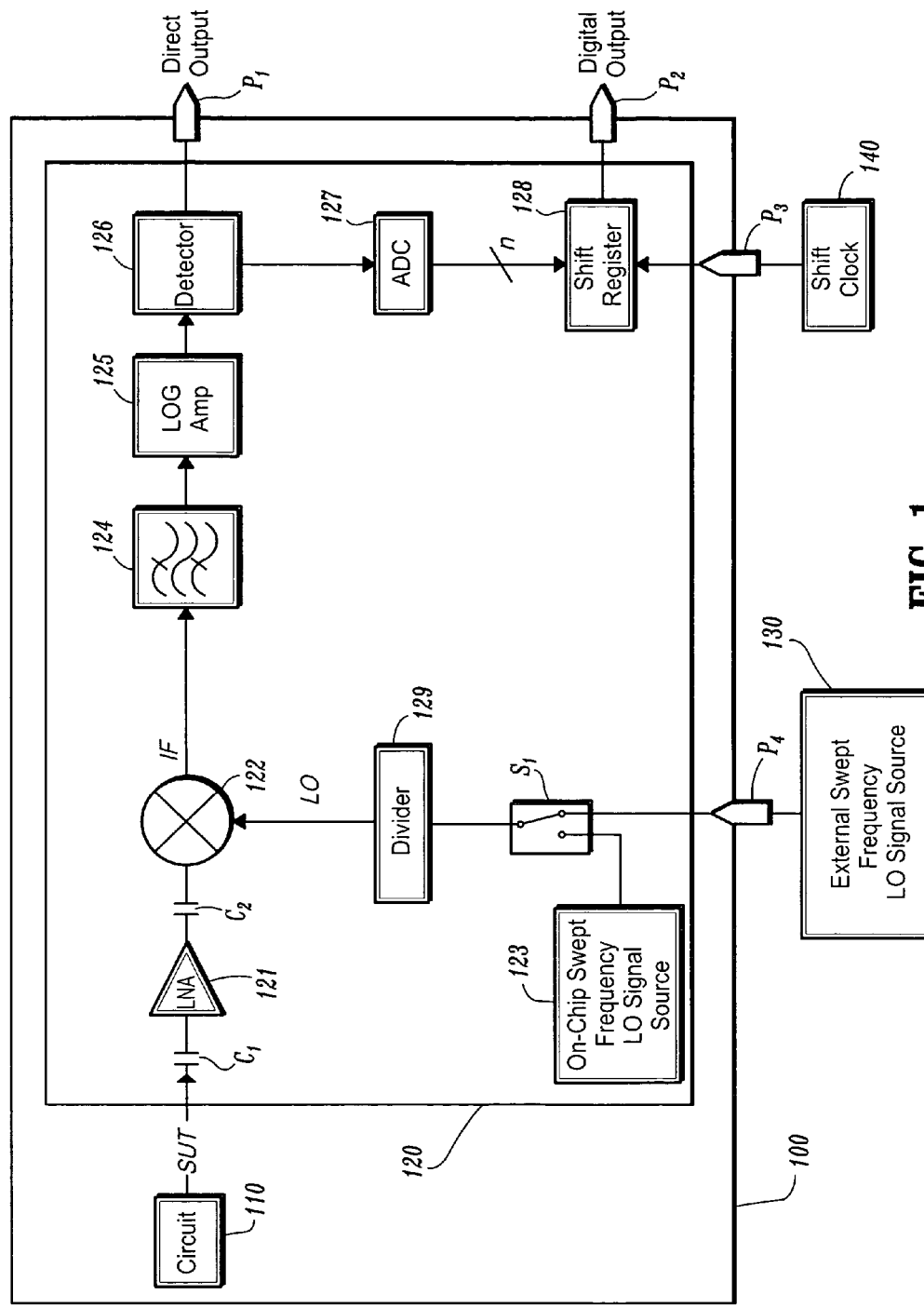
FIG. 1 schematically illustrates an integrated circuit comprising an integrated spectrum analyzer according to an exemplary embodiment of the invention.

FIG. 1 schematically illustrates an IC (integrated circuit) chip comprising an integrated spectrum-analyzer according to an exemplary embodiment of the invention. More specifically, FIG. 1 schematically illustrates a semiconductor chip (100) (or die) comprising an integrated circuit (110) (or component) and an integrated (on-chip) spectrum analyzer circuit (120) that directly measures the frequency spectrum of an internal chip signal, or a SUT (signal under test), generated by the integrated circuit (110). For example, the integrated circuit (110) may be a PLL (phase locked-loop), whereby an output signal (SUT) of the PLL is analyzed by the integrated spectrum analyzer (120) to determine if the frequency of the SUT is at its required value, to study the phase noise of the SUT, to determine if there is any crosstalk from noise sources with frequencies close to that of the SUT, etc.

In general, the integrated spectrum analyzer (120) comprises a single conversion, zero IF or near-zero IF architecture, which (as explained below) provides sufficient resolution bandwidth for on-chip diagnostics, as well as a low-power compact design for on-chip implementation. The exemplary integrated spectrum analyzer circuit (120) comprises an LNA (low noise amplifier) (121), a mixer (122), capacitors ($C_1$) and ($C_2$), an on-chip swept frequency LO (local oscillator) signal source (123), a low-frequency on-chip filter (124), a logarithmic (LOG) amplifier (125), a detector (126), an ADC (analog-to-digital-converter) (127), a shift register (128), a frequency divider (129), and a switch (S1) (or multiplexer). The functions of these components will be discussed below.

Moreover, the exemplary semiconductor chip (100) comprises a plurality of output pins/pads (P1) and (P2) for outputting spectrum measurement data, and a plurality of input pins/pads (P3) and (P4) for inputting external signals for operating the integrated spectrum analyzer circuit (120). For example, an external LO signal can be supplied via input pin (P4) by an external swept frequency LO signal source (130), and a clock signal for operating the shift register (128) can be supplied via input pin (P3) by an external shift clock circuit (140).

The integrated spectrum analyzer circuit (120) generally operates as follows. A SUT (signal under test) having a desired carrier (fundamental) frequency, $f_c$, is output from the circuit (110) and applied to an input (front end) of the spectrum analyzer (120). The LNA (121) is an optional front-end component of the integrated spectrum analyzer circuit (120), which is employed to amplify the signal power of the SUT while adding minimal noise and distortion to the SUT. Any suitable design topology may be implemented for the LNA (121), which enables high integration and low power consumption. The DC blocking capacitors ($C_1$) and ($C_2$) can be connected to the input and output of the LNA (121) to block intrinsic DC offset signals in the signal path.

The mixer (122), the on-chip swept LO signal source (123) (or the external swept LO signal source (130)) and the filter (124) comprise a frequency converter circuit that down-converts the frequency components of the SUT to an intermediate frequency (zero or near-zero IF) that can be readily measured and processed using on-chip circuitry. More specifically, the mixer (122) performs a mixing operation by multiplying the amplified SUT signal (which is output from the LNA (121)) and a swept LO signal (which is generated by the on-chip or external swept LO signal source (123) or (130)). The on-chip swept LO signal source (123) may comprise a tunable local oscillator circuit whose frequency is adjusted by a tuning controller. For example, the tunable local oscillator circuit may comprise an integrated VCO (voltage controlled oscillator) and the tuning controller may comprise a ramp generator that produces a ramped voltage that tunes the VCO. The switch (S1) can be controlled to select the LO signal from either the on-chip or external swept LO signal source (123) or (130). As explained below, the frequency divider (129) may be optionally implemented to divide the LO signals output from the swept LO signal sources (123) or (130) when the LO signals are generated at higher than desired frequencies to eliminate DC offsets resulting from self-mixing of the LO signal.

The SUT is mixed with the swept LO signal by the mixer (122), which generates an IF output that is the product of the input SUT and LO signals. In particular, the IF output of the mixer (122) includes the frequencies of the SUT and LO signals and their harmonics, as well as the sums and differences of the SUT and LO frequencies and their harmonics. The output of the mixer (122) is further processed (filtered, amplified, rectified, etc.) to extract the desired signals.

In particular, the output of the mixer (122) is filtered via the low-frequency on-chip filter (124) (which can be an active low-pass filter or active band-pass filter) to extract the desired sum or difference of the original SUT and LO signals. The resulting sum or difference components are filtered to the required bandwidth resolution by the low-frequency on-chip active filter (124). The filter (124) removes unwanted image frequencies and bleed-through LO and SUT frequencies, and otherwise eliminates down-converted energy of signals that are outside the desired channel or frequency bandwidth. In one exemplary embodiment, filter (124) is designed to contribute little flicker noise and to tolerate several tens of mVs of DC offset that can appear at the output of the mixer (122) due to self mixing of the LO. For example, the filter (124) can be implemented using the known active filter topology known as Sallen and Key filter, which implements an operational amplifier connected in unity-gain, which design can withstand large DC offsets.

The filtered IF signal output from the filter (124) is amplified by the LOG amplifier (125). The LOG amplifier (125) compresses the amplitude range. In one exemplary embodiment, the logarithmic amplifier (125) employs a series of amplifier stages to obtain a desired high gain for very low input amplitudes and low gain (by removing successive stages as they saturate) for large input swings, making a piecewise linear implementation of the log curve.

The detector (126) (or envelope detector) comprises a rectifier circuit which rectifies the IF signal output from the LOG amplifier (125) to produce a voltage level relative to the amount of power received from the incoming SUT. As the swept LO is mixed with the SUT, the detector (126) produces a corresponding voltage level, or power measurement. In one exemplary embodiment, the detector (126) comprises a rectifier followed by a large capacitor which converts the low IF frequency output of the LOG amplifier (125) to a DC voltage, which voltage is proportional to the logarithm of the amplitude of the frequency of the LO. Thus, as the LO is swept over a range, a voltage representing the logarithm of the frequency spectrum is generated. The voltage output from the detector (126) can be directly sent off chip (via output pin P1) to be displayed on an oscilloscope synchronized to the swept LO frequency.

Moreover, the output of the detector (126) can be digitized by the ADC (127), which generates n-bit data blocks each representative of the measured frequency spectrum of the SUT at discrete times. The n-bit data blocks representative of the measured frequency spectrum of the SUT can be sequentially stored in the n-bit shift register (128) and output from the chip (100) via the output pin (P2) under operation of the clock signal input from the external shift clock circuit (140) via input pin (P3). In this manner, each bit of an n-bit data block of the digital representation of the measured frequency spectrum of the SUT can be serially output from the output pin (P2) and acquired by a low speed digital tester.

With an integrated spectrum analyzer circuit according to an exemplary embodiment of the invention comprising a zero IF or near-zero IF architecture wherein a high frequency SUT is down-converted to a zero or near-zero IF, the amplification and filtering can be readily performed using on-chip circuitry in a low frequency band from about DC to a desired signal bandwidth. In one exemplary embodiment of the invention, the IF can be selected in a range of about 0 Hz (DC) to about 1% of the carrier frequency, $f_c$, of the SUT. To measure the frequency spectrum of a SUT, the amplitude of the SUT is measured as a function of frequency at some offset from the carrier frequency. For example, in one embodiment, the SUT can be mixed with a swept LO signal that sweeps from about the carrier frequency, $f_c$, of the SUT to a short bandwidth away from the SUT such that SUT is down-converted to obtain a spectrum of the SUT from DC (or near DC) to, e.g., 10 MHz (abut 10 MHz bandwidth). For example, for a SUT with a carrier frequency, $f_c$, of 4 GHz, the LO signal can be swept from about 4 GHz to 4.01 GHz. It is to be understood, however, that the LO can be swept over any range depending on the application.

With a zero IF or near-zero IF architecture, intrinsic DC offsets in the signal path can be amplified and degrade circuit performance (e.g., lower dynamic range). As noted above, for SUTs with no useful information content at DC, the DC blocking capacitors ($C_1$) and ($C_2$) can prevent such DC offsets.

In addition, time varying DC offsets can be generated at the output of the mixer due to self-mixing of the LO signal (the LO signal leaks to the SUT input of the mixer) when, for instance, the LO signal is routed across the chip. In one exemplary embodiment of the invention, to reduce self-mixing, the LO frequency is brought onto the chip at a multiple of the frequency to be measured, and divided by the same multiple to produce an on-chip LO with a reduced signal level. For example, in the exemplary embodiment of FIG. 1, the LO signal can be generated at twice the desired LO frequency, and then the LO signal can be divided on-chip via the divider (129) before being input to the mixer (122). For instance, with a SUT having a carrier frequency of 4 GHz, a swept LO signal can be generated starting at 8 GHz, which is divided by 2 via the divider (129). The divider (129) can be disposed near the mixer (122) to eliminate or significantly reduce self-mixing of the LO output from the divider (129). Moreover, any signal components output from the mixer (122) that are generated due to self-mixing of the 2× LO signal is attenuated (filtered) by the filter (124) and thus, not detected by detector (126).

As noted above, the implementation of a zero IF or near-zero IF framework of the exemplary spectrum analyzer circuit (120) of FIG. 1 enables a low-power compact design with sufficient resolution bandwidth for on-chip implementation and diagnostics of internal chip signals. Conventionally, general purpose spectrum analyzers are typically designed using a superheterodyne receiver architecture in which the signal-under-test (SUT) is subjected to several frequency conversions to generate various IF signals prior to being amplified and detected. With such conventional designs, to achieve adequate frequency resolution, IF filters must be made highly selective-and to achieve high selectivity, the IF filters are typically implemented using cascaded surface-acoustic-wave (SAW) filters or ceramic filters or high-Q inductor-capacitor (LC) tuned circuits in older spectrum analyzers, which must be assembled on a circuit board. Thus, the intermediate frequencies are chosen to be compatible with available SAW or ceramic filters and are typically on the order of several hundred MHz. Spectrum analyzers for general-purpose laboratory use typically use multiple frequency conversions and multiple cascaded IF filters to achieve extremely small resolution bandwidths as low as 1 Hz.

Currently, there are no semiconductor fabrication techniques that enable SAW or ceramic filters to be implemented on silicon IC chips. Moreover, it is not practical to build IF filters using on-chip inductors and capacitors due to, e.g., the low-Q of such on-chip inductors and capacitors, as well as the large chip area that would be consumed by filters constructed with such components.

Advantageously, an integrated spectrum analyzer for on-chip diagnostics according to the invention implements a zero or near-zero IF architecture, which does not require a high-Q IF filter. Indeed, if a SUT is converted to an IF which is small with respect to the SUT carrier frequency, then adequate selectivity (i.e. small resolution bandwidth) can be achieved even with a filter which does not have extremely high Q. That is, the fractional bandwidth of the filter output can then be small with respect to the SUT frequency even if it is not small with respect to the filter cutoff frequency.

In high-performance, general-purpose spectrum analyzers, zero-IF or very-low-IF architectures would not be practical because the DC offset voltage drift, filter component values, and mixer 1/f noise would make it difficult (or impossible) to achieve an extremely small resolution bandwidth as low as 1 Hz. However, in accordance with integrated spectrum analyzers according to exemplary embodiments of the invention for on-chip diagnostic and measurements of high frequency signals, resolution bandwidths of less than 10 kHz are not necessarily required, which enables efficient implementation of on-chip filters. Moreover, with an on-chip implementation, DC offset voltages are more readily controlled than in a discrete component implementation, due to superior component matching. Indeed, circuit designs and methods that provide precision matching of device characteristics for analog or mixed-signal semiconductor integrated circuits can be implemented to eliminate or reduce DC offsets. Thus, the specific requirements of on-chip diagnostics and the advantages of single-chip integration make possible this more economic and elegant solution for integrated spectrum analyzer circuits.

There are other spectrum analyzer architectures, e.g., FFT (fast fourier transform) analyzers, which could achieve small resolution bandwidths without the use of SAW filters, however they are much more complex than exemplary architectures according to the invention. For instance, the FFT spectrum analyzers do not use a mixer, but instead directly convert an SUT into digital form using an analog-to-digital converter (ADC). However, because the ADC must operate at the frequency of the SUT, the ADC will consume large amounts of power and chip area. Also, an ADC will be required for each SUT, unless a mechanism is provided for switching multiple signals to the ADC, which in any event, is undesirable because of the high frequency signal routing required and the possibility of corrupting high frequency SUTs by using switches. In accordance with the present invention, the LNA and mixer integrated components are compact and can easily be duplicated on-chip for each SUT to implement an integrated spectrum analyzer capable of measuring multiple on-chip signals.

Figure 2:
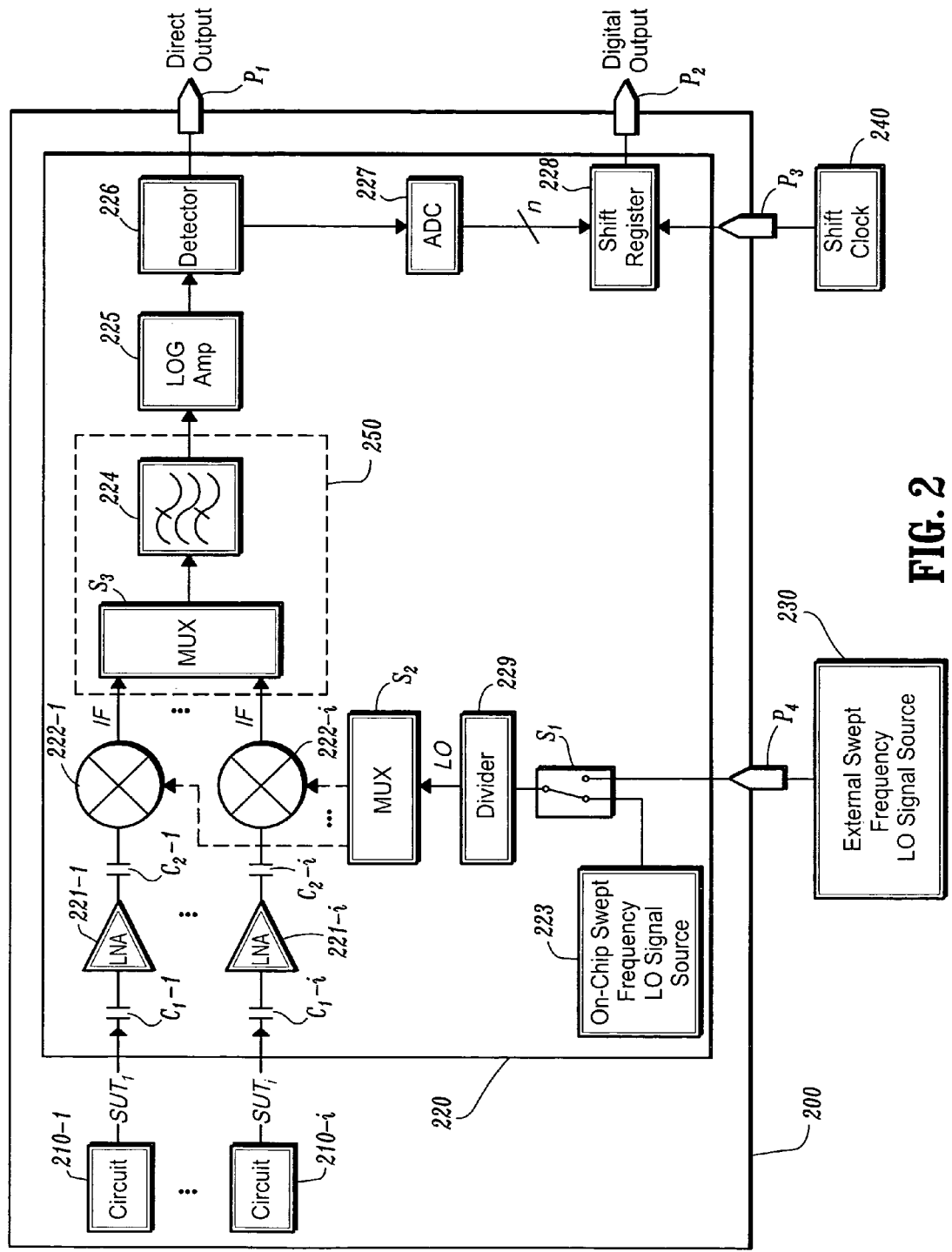
FIG. 2 schematically illustrates an integrated circuit comprising an integrated spectrum analyzer according to another exemplary embodiment of the invention.

For instance, FIG. 2 schematically illustrates an integrated circuit comprising an integrated spectrum analyzer according to another exemplary embodiment of the invention. More specifically, FIG. 2 schematically illustrates a semiconductor chip (200) (or die) comprising a plurality of integrated circuits (210-1 ... 210-$i$) (or components) and an integrated (on-chip) spectrum analyzer circuit (220) that directly measures the frequency spectrum of various internal chip signals, or SUTs, generated by the integrated circuits (210-1, ..., 201-$i$). The integrated circuits (210-1, ..., 201-$i$) may be separate circuits and or various circuits or components of a complex SOC (system on chip.), for example.

In general, the integrated spectrum analyzer (220) comprises a plurality of LNAs (221-1, ..., 221-$i$), mixers (222-1, ..., 222-$i$)) and capacitors ($C_1$-1, ..., $C_1$-i) and ($C_2$-1, ..., $C_2$-i), an on-chip swept frequency LO (local oscillator) signal source (223), a low-frequency on-chip filter (224), a logarithmic amplifier (225), a detector (226), an ADC (analog-to-digital converter) (227), a shift register (228), a frequency divider (229), and a plurality of switches (S1, S2, S3) (or multiplexers).

Moreover, the exemplary semiconductor chip (200) comprises a plurality of output pins/pads (P1) and (P2) for outputting spectrum measurement data and a plurality of input pins/pads (P3) and (P4) for inputting external signals for operating the integrated spectrum analyzer circuit (220). For example, an external LO signal can be supplied via input pin (P4) by an external swept frequency LO signal source (230), and a clock signal for operating the shift register (228) can be supplied via input pin (P3) by an external shift clock circuit (240).

In general, the various components of the exemplary integrated spectrum analyzer (220) of FIG. 2 are similar to those components of the integrated spectrum analyzer (120) of FIG. 1, except that the integrated spectrum analyzer circuit (220)

comprises a plurality of LNA and mixer pairs, which are duplicated for each SUT to be measured, wherein each mixer (222-1, ..., 222-i) can be selectively connected to the filter (224) via the multiplexer (S3). Moreover, in the exemplary embodiment of FIG. 2, a single swept LO source (223) or (230) is used for all the mixers (222-1, ..., 222-i), wherein the swept LO signal can be selectively input to a desired mixer (222-1, ..., 222-i) by operation of the multiplexer (S2). In this regard, the swept frequency LO signal sources (223) or (230) can be designed to be switchable and tunable, i.e., switchable to one of multiple frequency ranges and tunable within the selected frequency range. With the exemplary design of FIG. 2, each LNA and mixer pair can be disposed near the internal node that includes the SUT, and the low frequency output signals (IF) of the mixers (222-1, ..., 222-i) can be routed/distributed over the chip (200) using long wires to selectively connect to the filter (224) via the multiplexer (S3) without degrading the signal.

In the exemplary embodiment of FIG. 2, a filter portion (250) of the integrated spectrum analyzer circuit (220) comprises one filter (224) for selectively filtering the IF output from the various mixers (222-1, ..., 222-i). In other exemplary embodiments, the filter portion (250) can be modified with different circuit architectures for, e.g., applications in which it is desirable for the mixers (222-1, ..., 222-i) to have different IF outputs, or where it is desirable to have a plurality of low-frequency filters with different cutoff frequencies to enable measurements with different resolution bandwidths.

Figure 3:
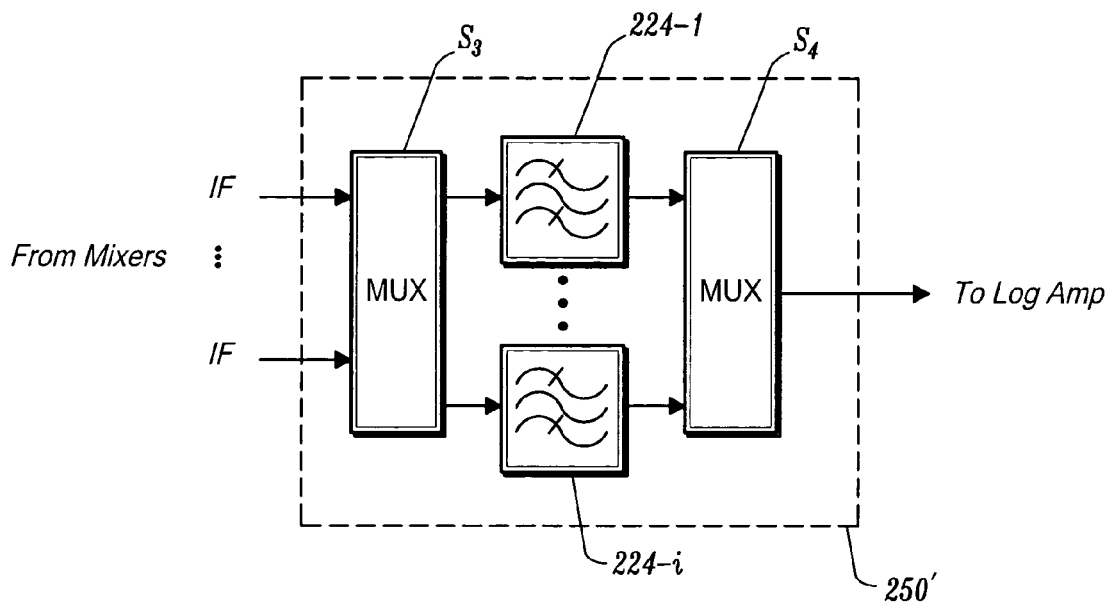
FIG. 3 schematically illustrates a filter circuit according to another exemplary embodiment of the invention, which can be implemented in the circuit of FIG. 2.

More specifically, by way of example, FIG. 3 schematically illustrates a filter circuit (250') according to another exemplary embodiment of the invention, which can be implemented in place of the filter circuit (250) in FIG. 2. In FIG. 3, the filter circuit (250') comprises a plurality of multiplexers (S3) and (S4) and a plurality of low-frequency active filters (224-1, ..., 224-i), wherein each filter (224-1, ..., 224-i) has a different cutoff frequency to enable measurements with different resolution bandwidths.

In the exemplary embodiment, the multiplexer (S3) selectively applies an IF output signal from one of the plurality of mixers (222-1, ..., 222-i) (FIG. 2) to each of the filters (224-1, ..., 224-i), and the multiplexer (S4) selectively applies the filtered IF signal from one of the filters (224-1, ..., 224-i) to the LOG amplifier (225) (FIG. 2) depending on the desired measurement resolution. The bandwidth of the filters (224-1, ..., 224-i) are varied, which provides for programmability of the measurement resolution and thus greater versatility of the integrated spectrum analyzer circuit.

Figure 4:
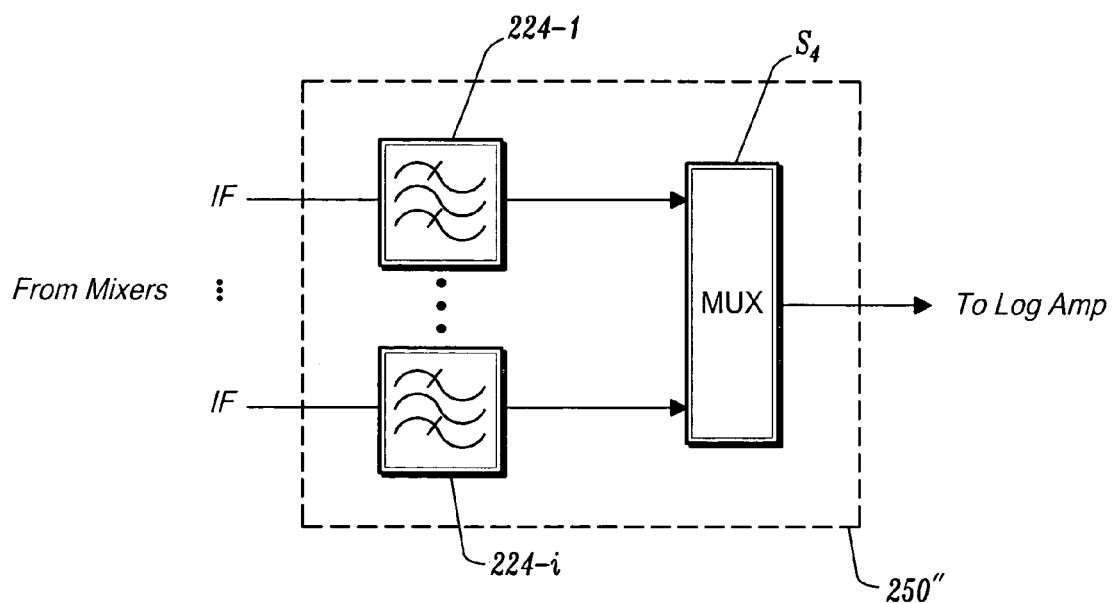
FIG. 4 schematically illustrates a filter circuit according to another exemplary embodiment of the invention, which can be implemented in the circuit of FIG. 2.

By way of further example, FIG. 4 schematically illustrates a filter circuit (250") according to another exemplary embodiment of the invention, which can be implemented in place of the filter circuit (250) of FIG. 2, to enable processing of different IF signals. In FIG. 4, the filter circuit (250") comprises a multiplexer (S4) and a plurality of low-frequency active filters (224-1, ..., 224-i) which are designed for filtering different IF signals (although possibly providing the same resolution bandwidth). Each filter (224-1, ..., 224-i) is directly connected to an output of a respective mixer (222-1, ..., 222-i) (FIG. 2) and designed to filter the IF signal output from the respective mixer. Depending on the SUT to be measured, the multiplexer (S4) selectively applies the filtered IF signal output from one of the filters (224-1, ..., 224-i) to the LOG amplifier (225) (FIG. 2). The ability to process different IF signals enables greater versatility of the integrated spectrum analyzer circuit.

It is to be understood that in the exemplary embodiments described herein, the various components such as the switches/multiplexers can be controlled by an internal controller or external controller. For example, the switches and multiplexers in the exemplary embodiments can be controlled by control signals that are input (via a chip input pin) from a digital tester which is used to acquire and process the digitized frequency spectrum data. In this regard, the control signals can be further processed via on-chip control logic for decoding the external control signals and generating the necessary switch/multiplexer control signals to operate the on-chip switches/multiplexers of an integrated spectrum analyzer circuit. In other exemplary embodiments of the invention, an integrated spectrum analyzer circuit may comprise an on-chip controller that executes an embedded program to operate the integrated spectrum analyzer and perform one or more test procedures to obtain frequency spectrum data.

The core components of integrated spectrum analyzer circuits such as depicted above have been implemented by the present inventors using an IBM CMOS7SF technology (although it is to be understood that other implementations are possible) An LNA with a bandwidth from 40 MHz to 4 GHz was used and a Sallen and Key filter topology was implemented for the on-chip active filter, which generates little flicker noise and tolerates several tens of mVs of dc offset that appear at the output of the mixer due to self-mixing of the LO. An integrated spectrum analyzer circuit according to an exemplary embodiment of the invention can effectively operate over a frequency range up to 4 about GHz while providing a dynamic range of 60 dB.

Although exemplary embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method for measuring a frequency spectrum of an internal chip signal, the method comprising the steps of:
   generating an analog internal signal by an integrated circuit of a semiconductor IC (integrated circuit) chip;
   on-chip mixing the internal signal with a swept LO (local oscillator) signal to generate an IF (intermediate frequency) signal, the IF signal comprising a zero IF (intermediate frequency) or near-zero IF signal, wherein frequency components of the internal signal are down-converted to the IF;
   on-chip filtering the IF signal to generate a filtered IF signal;
   on-chip amplifying the filtered IF signal to generate an amplified IF signal; and
   on-chip producing a voltage level of the amplified IF signal proportional to a logarithm of the amplitude of the frequency of a swept frequency LO (local oscillator) signal source.

2. The method of claim 1, further comprising on-chip digitizing the voltage level of the amplified IF signal.

* * * * *